US007363013B2

(12) United States Patent
Kuo et al.

(10) Patent No.: US 7,363,013 B2
(45) Date of Patent: Apr. 22, 2008

(54) PHASE LOCK LOOP APPLYING IN WIRELESS COMMUNICATION SYSTEM AND METHOD THEREOF

(75) Inventors: Chang-Fu Kuo, Hsin-Chu (TW);
Ling-Wei Ke, Hsin-Chu (TW);
Jen-Chiou Bo, Hsin-Chu (TW);
Shou-Tsung Wang, Hsin-Chu (TW);
Kuang-Kai Teng, Hsin-Chu (TW)

(73) Assignee: MediaTek Inc., Hsin-Chu City (TW)

( * ) Notice: Subject to any disclaimer, the term of this patent is extended or adjusted under 35 U.S.C. 154(b) by 366 days.

(21) Appl. No.: 10/693,962

(22) Filed: Oct. 28, 2003

(65) Prior Publication Data

US 2004/0087289 A1 May 6, 2004

(30) Foreign Application Priority Data

Oct. 31, 2002 (TW) ............................... 91132326 A

(51) Int. Cl.
*H04B 1/04* (2006.01)
(52) U.S. Cl. .................. 455/112; 455/113; 375/302
(58) Field of Classification Search .................. 455/75,
455/76, 108, 110, 112, 113, 115.1, 119, 126,
455/260; 375/295, 300, 302, 371, 373, 374,
375/375, 376; 331/1 R, 12, 17, 18
See application file for complete search history.

(56) References Cited

U.S. PATENT DOCUMENTS 5,304,957 A * 4/1994 Edwards ...................... 331/12
5,519,887 A * 5/1996 Lieu ........................... 455/266
6,018,275 A 1/2000 Perrett et al. ................ 332/127
6,163,585 A 12/2000 Yamawaki et al. .......... 375/373
6,483,388 B2 * 11/2002 Khan ........................... 331/18
6,693,969 B1 * 2/2004 Montalvo et al. ........... 375/259
6,961,400 B1 * 11/2005 Huff et al. ................... 375/376

FOREIGN PATENT DOCUMENTS

| EP | 0905879 A1 | 3/1999 |
| WO | WO 95/16304 | 6/1995 |
| WO | WO 00/76058 A1 | 12/2000 |
| WO | WO 02/31963 A2 | 4/2002 |

* cited by examiner

*Primary Examiner*—Quochien B. Vuong
(74) *Attorney, Agent, or Firm*—Troxell Law Office, PLLC

(57) ABSTRACT

A phase lock loop receives a baseband signal which has an input frequency, and modulating the baseband signal to be a corresponding RF signal which has a predetermined transmission frequency for transmitting. The phase lock loop comprises a programmable divider, a modulator, a phase detector, a charging pump, a loop filter, a voltage-controlled oscillator and a frequency converter. The programmable divider divides the frequency of a local oscillating signal by a programmable divisor to generate a reference signal. The modulator receives the baseband signal, modulates the frequency of the reference signal according to the baseband signal, and generates a corresponding first comparison signal. The frequency converter receives the feedback RF signal and the local oscillating signal and outputs the second comparison signal according to the frequency difference. The divisor of the divider is programmable to avoid the spur frequency being generated because the local oscillating signal is interfered.

24 Claims, 8 Drawing Sheets

PHASE LOCK LOOP APPLYING IN WIRELESS COMMUNICATION SYSTEM AND METHOD THEREOF

BACKGROUND OF THE INVENTION

1. Field of the Invention

This present invention relates to a phase lock loop, and more particularly, the present invention relates to a phase lock loop applied in wireless communication systems.

2. Description of the Prior Art

In a wireless communication system, a phase lock loop is used to generate a transmission signal that has specific phase and specific frequency. In a conventional phase lock loop, the specific frequency is generated through the following steps: first, generating a local oscillating frequency by a frequency synthesizer; next, dividing the local oscillating frequency by a fixed divider and inputting the signal with a reduced frequency into the phase detector; then, generating a control signal; and finally, generating the specific frequency by the control signal. Therefore, for the same specific frequency, the corresponding local oscillating frequency is fixed. However, because of the noise interference, the signal quality of the corresponding fixed local oscillating frequency becomes worse, and the signal quality of the transmission signal of the phase lock loop is also worsened.

There are several kinds of frequency synthesizer, but each of them has different kinds of noise interferences. For example, the interference caused by the multiplied frequency of the crystal oscillator frequency, that is when the desired local oscillating frequency approaches the multiples of a certain spur frequency, the local oscillating frequency is easily interfered. Thus, around the desired local oscillating frequency from several kHz to 1 MHz, there will be some interference signals.

The conventional method for preventing the noise interference focused on the improvement of the frequency synthesizer, but that will make the circuit more complicated and increase the cost of production. When the problem of interference remains unsolved, that frequency might not be usable, or that frequency might have a lower usage quality.

SUMMARY OF THE INVENTION

An objective of the invention is to provide a phase lock loop that applies in wireless communication systems and a method for generating a RF signal. The phase lock loop is used to receive a baseband signal that has an input frequency and modulate the baseband signal to be a corresponding RF signal. The RF signal has a predetermined transmission frequency for transmitting.

According to a preferred embodiment of the present invention, the phase lock loop comprises a frequency synthesizer, a first programmable divider, a modulator, oscillating signal generator, and a frequency converter. The frequency synthesizer is used to generate a local oscillating signal that has a local oscillating frequency. The first programmable divider is used to divide the frequency of the local oscillating signal by a first programmable divisor to generate a reference signal. The modulator is used to modulate the frequency of the reference signal according to the baseband signal to generate a corresponding first comparison signal. The oscillating signal generator is used to generate the corresponding RF signal for transmitting according to the corresponding control voltage generated by the phase difference between the first comparison signal and a second comparison signal. The RF signal is fed back as a feedback signal. The frequency converter is used to receive the feedback signal and the local oscillating signal and output the second comparison signal to the phase detector in responsive to the frequency difference of the feedback signal and the local oscillating signal. Provided that a carrier frequency of the RF signal substantially equals to a predetermined value, the first programmable divisor of the first programmable divider as well as the corresponding local oscillating frequency of the local oscillating signal are capable of being programmable-controlled.

According to the phase lock loop of the present invention, the first programmable divisor of the first programmable divider is programmable-controlled so as to prevent the occurrence of a spur frequency in the RF signal, besides the predetermined transmission frequency, due to the interfered local oscillating signal. By using the present invention, all channels of the global system for mobile communication (GSM) can select a suitable local oscillating frequency, without having problems of low quality output signals.

The advantage and spirit of the invention may be understood by the following recitations together with the appended drawings.

BRIEF DESCRIPTION OF THE APPENDED DRAWINGS

DETAILED DESCRIPTION OF THE INVENTION

The present invention provides a phase lock loop, which applies in the RF signal transmission device of a wireless communication system, for receiving a baseband signal that has an input frequency ($F_i$) and modulating the baseband signal to be a corresponding RF signal ($F_{tx}$); the RF signal has a predetermined transmission frequency for transmitting.

Figure 1:
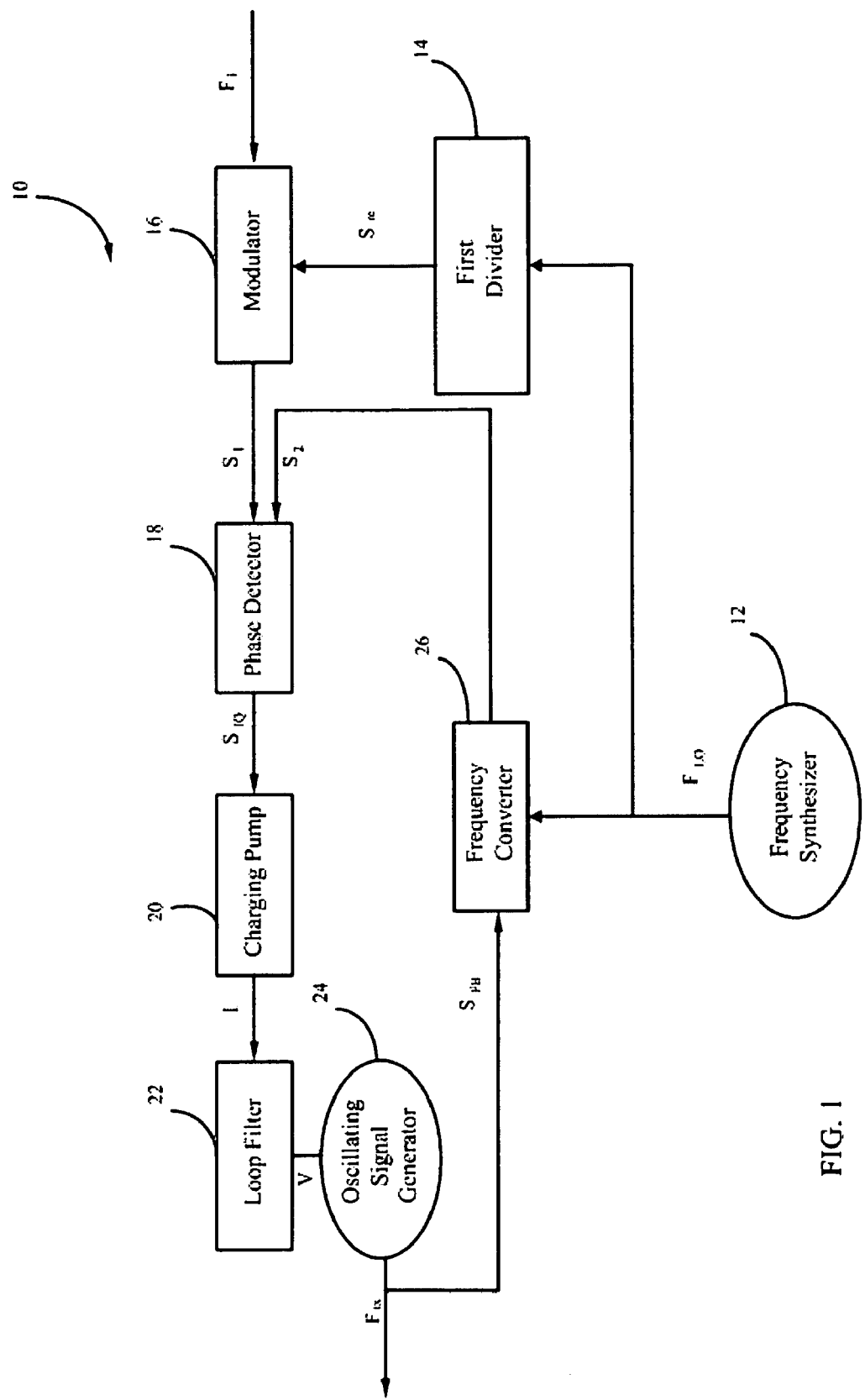
FIG. 1 is a function block diagram of a phase lock loop according to the present invention.

Referring to FIG. 1, FIG. 1 is a function block diagram of a phase lock loop 10 according to the present invention. The phase lock loop 10 comprises a frequency synthesizer 12, a first programmable divider 14, a modulator 16, a phase detector 18, a charging pump 20, a loop filter 22, an oscillating signal generator 24, and a frequency converter 26. In another preferred embodiment, the oscillating signal generator 24 may comprise a voltage-controlled oscillator (VCO) (not shown). In another preferred embodiment, the oscillating signal generator 24 may comprise a voltage-controlled oscillator (not shown) and a third frequency divider (not shown) coupled to an output of the voltage-controlled oscillator.

The frequency synthesizer 12 is used to generate a local oscillating signal that has a local oscillating frequency $F_{LO}$. The first programmable divider 14 divides the frequency of the local oscillating signal by a first programmable divisor M to generate a reference signal $S_{re}$. The modulator 16 modulates the frequency of the reference signal $S_{re}$ according to the baseband signal to generate a corresponding first comparison signal $S_1$.

The phase detector 18 is used to detect phases of the first comparison signal $S_1$ and a second comparison signal $S_2$ and output a corresponding current-controlled I/O signal $S_{IQ}$ in response to the phase difference between the two comparison signals $S_1$ and $S_2$. The charging pump 20 is used to receive the current-controlled I/O signal $S_{IQ}$ and accordingly output a corresponding control current I. The loop filter 22 filters the control current I to output a control voltage V to the voltage-controlled oscillator 24.

The voltage-controlled oscillator 24 generates the corresponding RF signal for transmitting, according to the control voltage V. The RF signal is fed back as a feedback signal $S_{FB}$. The frequency converter 26 receives the feedback signal $S_{FB}$ and the local oscillating signal to output the second comparison signal $S_2$ to the phase detector 18 in response to the frequency difference between the feedback signal $S_{FB}$ and the local oscillating signal.

Provided that a carrier frequency of the RF signal substantially equals to a predetermined value, the first programmable divisor of the first programmable divider as well as the corresponding local oscillating frequency of the local oscillating signal are capable of being programmable-controlled. In other words, the first programmable divisor M of the first programmable divider 14 is programmable-controlled, so as to prevent the occurrence of a spur frequency, besides the predetermined transmission frequency, in the RF signal due to the interfered local oscillating signal.

The following paragraphs describe how to prevent the local oscillating signal from being interfered by the first programmable divisor M that is programmable-controlled.

When the transmission frequency of the RF signal of the phase lock loop 10 is $F_{tx}$, the relative equation between $F_{LO}$ and the first programmable divisor M is $$F_{LO} = \frac{(M-1)}{M} \times F_{tx}.$$

$F_{tx}$ is a fixed value, and the conventional first programmable divisor M is also a fixed value. If the present result $F_{LO}$ is interfered by the other signal, the conventional method of changing the circuit can not solve the interference problem effectively. Therefore, if the first programmable divisor M is programmable-controlled, another $F_{LO}$ can be calculated to complete the phase lock loop 10 and obtain the same $F_{tx}$.

For example, the global system for mobile communication (GSM) uses the channel 631 as the signal transmission channel. The frequency of this channel is 1734 MHz. If the programmable divisor N is fixed as 9, from the equation $$F_{LO} = \frac{(M-1)}{M} \times F_{tx},$$

$F_{LO}$ can be calculated as 1950.75 MHz. However, the frequency 1950.75 MHz is very easily interfered by the multiple frequency of the reference frequency 13 MHz or 26 MHz that are often used by the frequency synthesizer of the global sim mobile system. In this situation, the first programmable divisor is changed to 11, and then $F_{LO}$ becomes 1907.41 MHz. The frequency 1907.4 MHz is 43.35 MHz apart from the frequency 1950.65 MHz, and the frequency 1907.4 MHz can prevent the interference from the multiple frequency of the reference frequency 13 MHz or 26 MHz.

Figure 2:
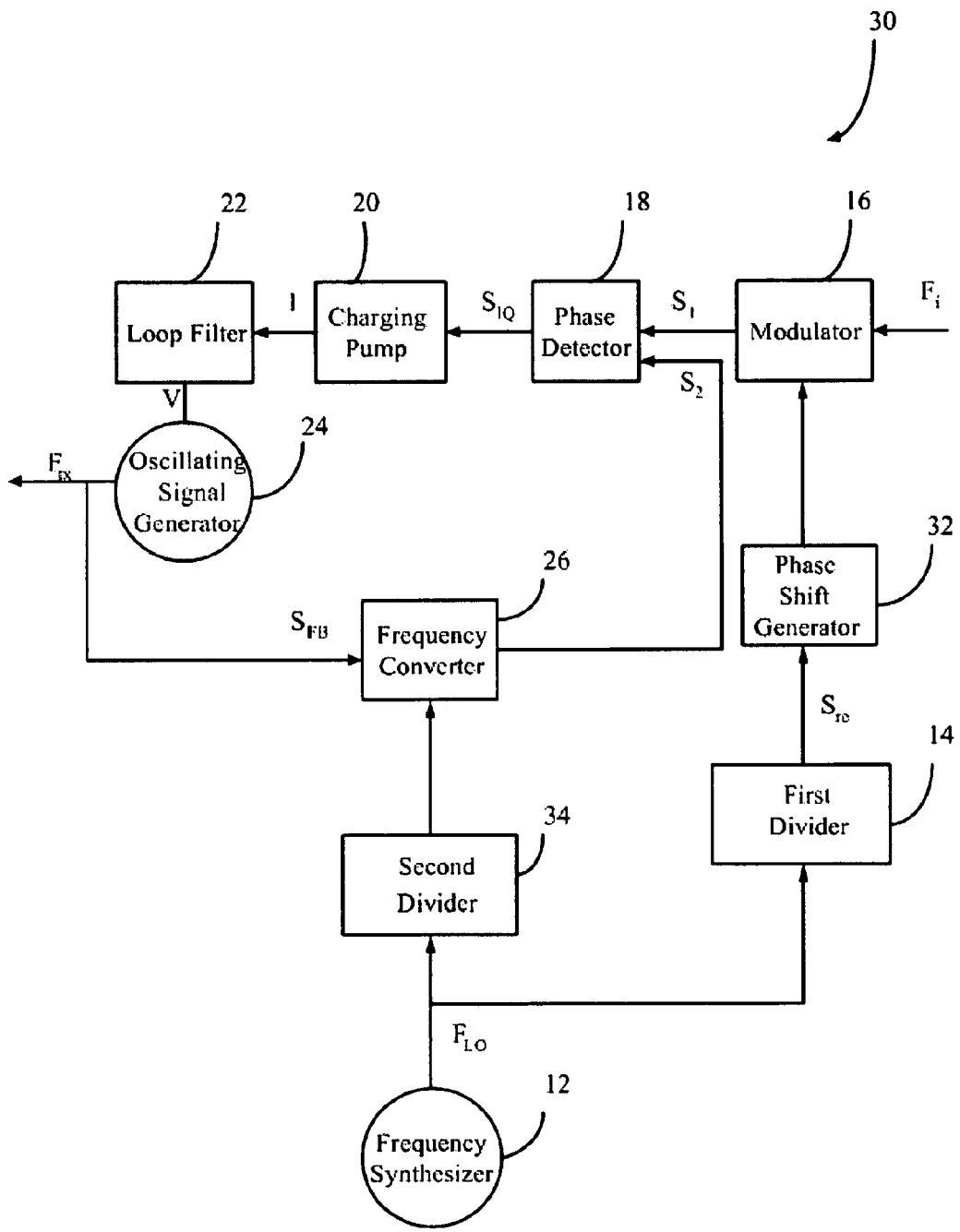
FIG. 2 is a function block diagram of a phase lock loop according to another preferred embodiment of the present invention.

Referring to FIG. 2, FIG. 2 is a function block diagram of a phase lock loop 30 according to another preferred embodiment of the present invention. Comparing the phase lock loop 10 in FIG. 1 with the phase lock loop 30 in FIG. 2, the phase lock loop 30 further comprises a phase shift generator 32 and a second programmable divider 34. The phase shift generator 32 is used to shift the phase of the reference signal $S_{re}$ generated by the first programmable divider 14 by 90 degrees, and then input the phase-shifted reference signal into the modulator 16. Before the local oscillating signal enters the frequency converter 26, the frequency of the local oscillating signal is first divided by the second programmable divisor N in the second programmable divider 34, and then the frequency-divided local oscillating signal enters the frequency converter 26.

In the phase lock loop 30, the transmission frequency $F_{tx}$ of the RF signal, the local oscillating frequency $F_{LO}$ of the local oscillating signal, the first programmable divisor M of the first programmable divider 14, and the second programmable divisor N of the second programmable divider 34 satisfy the following equation:

$$F_{tx} = \left(\frac{M \pm N}{M \times N}\right) \times F_{LO}$$

By this method, for the transmission frequency $F_{tx}$ of the fixed RF signal of the phase lock loop, the better local oscillating frequency $F_{LO}$ can be selected by changing the first programmable divisor M of the first programmable divider 14 and the second programmable divisor N of the second programmable divider 34, so as to avoid interfering the output signal of the phase lock loop by the specific local oscillating frequency $F_{LO}$.

Figure 3:
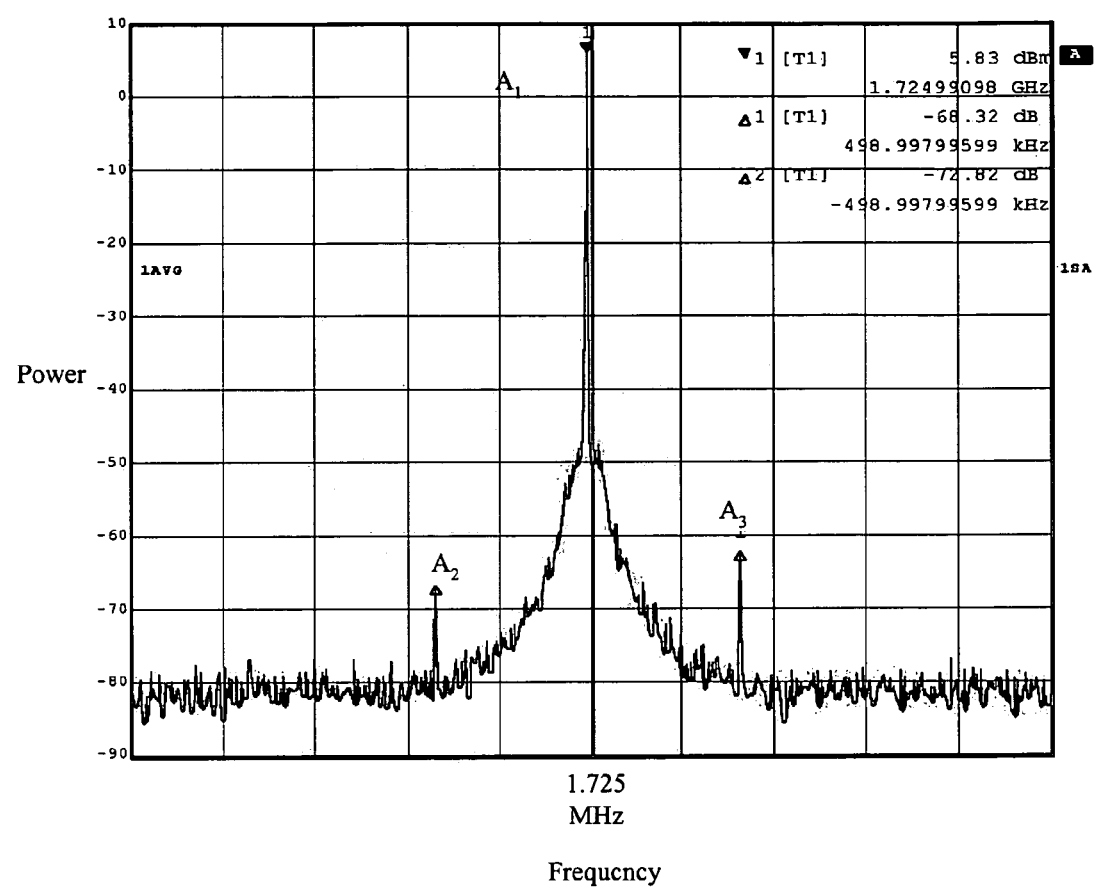
FIG. 3 is an experimental data curve of the transmission frequency as the first programmable divisor M of the phase lock loop 30, shown in FIG. 2, is equal to 11.

The following takes the experiment data of a preferred embodiment as an example to prove the effect of the present invention in real practice. The transmission frequency $F_{tx}$ of the embodiment is 1725 MHz. A local oscillating frequency $F_{LO}$ synthesized by the frequency synthesizer 12 of the phase lock loop 30 is 1897.5 MHz, and the reference signal $S_{re}$ is generated by the first programmable divider 14. When the baseband signal for modulating the reference signal $S_{re}$ has not been inputted, the output spectrum of the transmission frequency $F_{tx}$ of the phase lock loop 30 is shown in FIG. 3. FIG. 3 is an experimental data curve of the transmission frequency as the first programmable divisor M of the phase lock loop 30, shown in FIG. 2, is equal to 11. The horizontal axis in FIG. 3 represents the frequency, and the vertical axis represents the power, wherein each unit in the horizontal axis means 300 kHz. The maximum power of the transmission frequency $F_{tx}$ is the predetermined transmission channel, meaning that the transmission frequency $F_{tx}$ is 1725 MHz. From FIG. 3, when the first programmable divisor M of the first programmable divider 14 of the phase lock loop 30 is equal to 11, the maximum output power of the transmission frequency $F_{tx}$ is the apex $A_1$, 1725 MHz. However, the spur frequencies $A_2$ and $A_3$, not equal to 1725 MHz, also appear on the two sides of the frequency 1725 MHz at 500 kHz. Because the reference frequency 26 MHz used by the frequency synthesizer has the multiple frequency 1898 MHz (26×73=1898), and the multiple frequency is very close to the local oscillating frequency 1897.5 MHz, the interference occurs. After the interference passes the phase lock loop, the spur frequency $A_2$ and $A_3$ are generated on the two sides of the transmission frequency $F_{tx}$ 1725 MHz at about 500 kHz.

Figure 4:
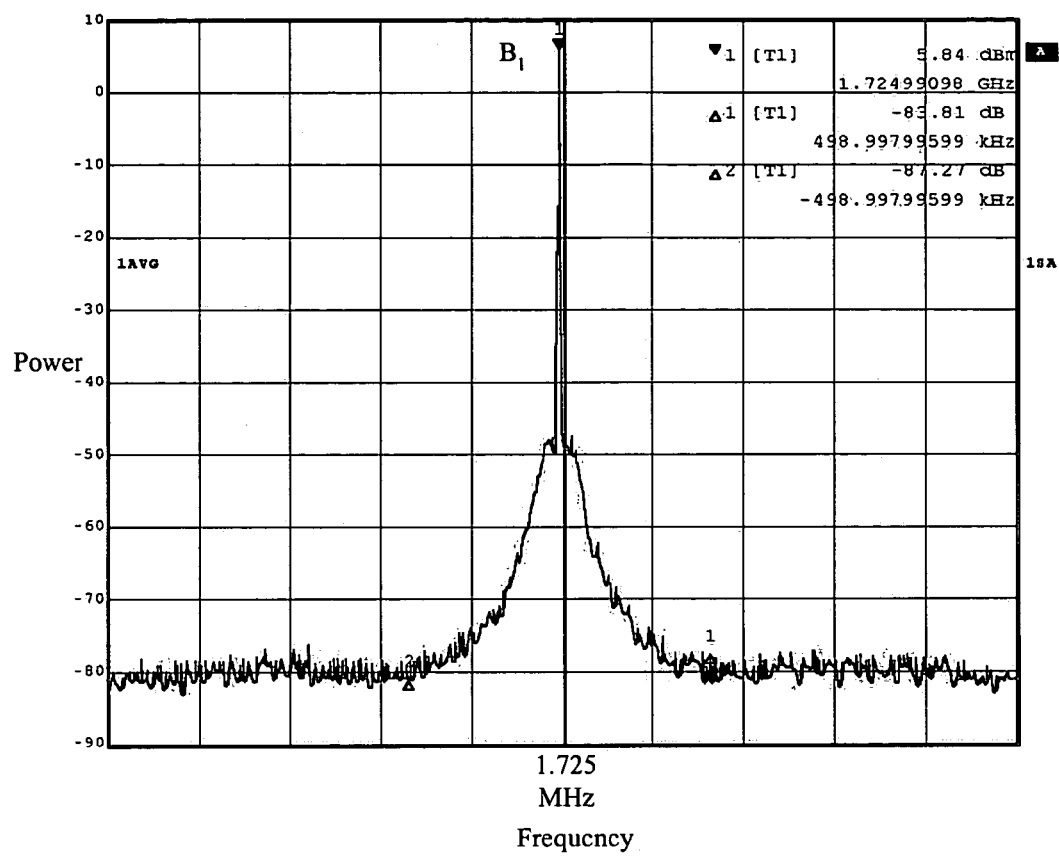
FIG. 4 is an experimental data curve of the transmission frequency as the first programmable divisor M of the phase lock loop 30, shown in FIG. 2, is equal to 9.

Because the local oscillating signal corresponded to the transmission frequency $F_{tx}$ 1725 MHz divided by the first programmable divisor 11 interferes the transmission frequency $F_{tx}$, the first programmable divider 14 further adjusts the first programmable divisor M to 9, and the corresponded local oscillating frequency is changed to 1940.625 MHz. This frequency 1940.625 MHz is far away from another multiple frequency 1950 MHz (26×75=1950). Referring to FIG. 4, FIG. 4 is an experimental data curve of the transmission frequency as the first programmable divisor M of the phase lock loop 30, shown in FIG. 2, is equal to 9. From FIG. 4, when the first programmable divisor is adjusted to 9, the maximum output power $B_1$ of the transmission frequency $F_{tx}$ is still 1725 MHz, but no spur frequency appears on the two sides of the frequency 1725 MHz any more.

Figure 5:
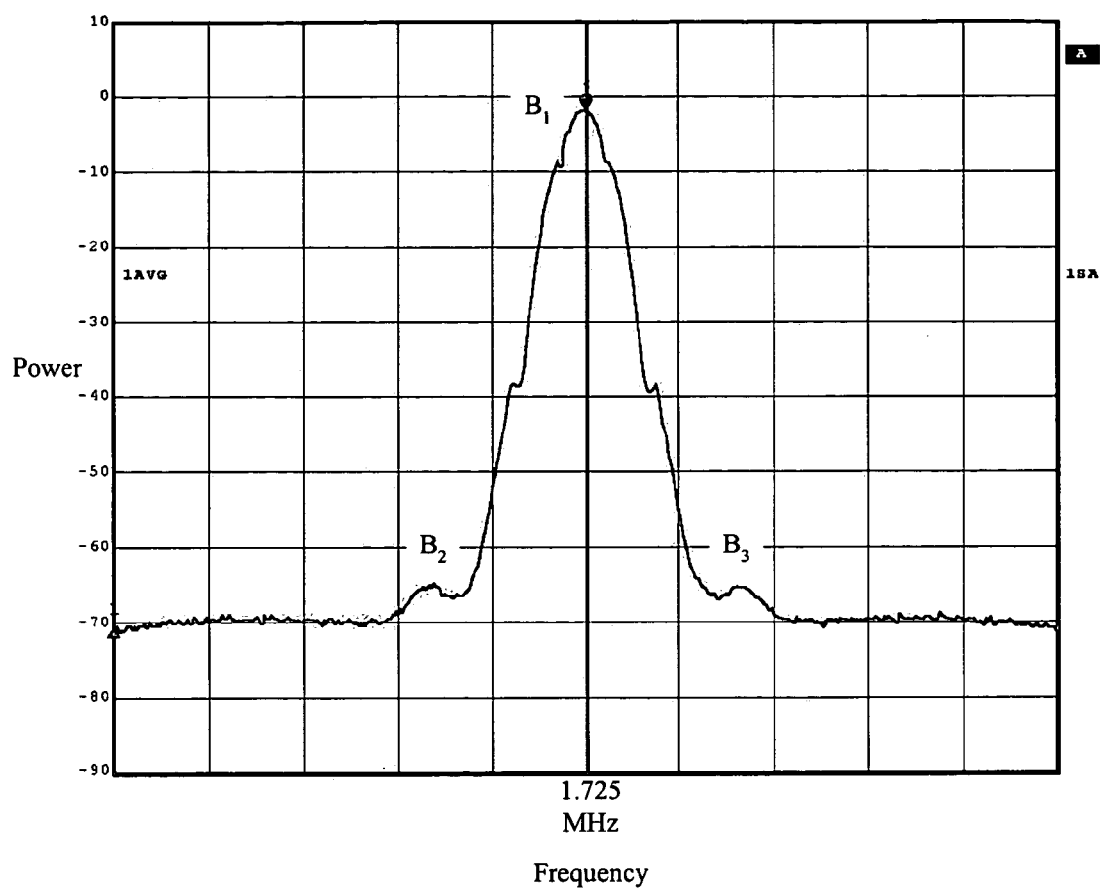
FIG. 5 is an experimental data curve of the transmission frequency modulated by the baseband signal shown in FIG. 3.

A local oscillating frequency $F_{LO}$ synthesized by the frequency synthesizer 12 of the phase lock loop 30 is 1897.5 MHz, and the reference signal $S_{re}$ is generated by the first programmable divider 14. The output spectrum of the transmission frequency $F_{tx}$ of the phase lock loop 30, after the reference signal $S_{re}$ is modulated by the inputted baseband signal, is shown in FIG. 5. FIG. 5 is an experimental data curve of the transmission frequency $F_{tx}$ modulated by the baseband signal shown in FIG. 3. The horizontal axis in FIG. 5 represents the frequency, and the vertical axis represents power, wherein each unit on the horizontal axis means 300 kHz. The maximum power of the transmission frequency $F_{tx}$ is also the predetermined transmission channel, meaning that the transmission frequency $F_{tx}$ is 1725 MHz. As shown in FIG. 5, when the first programmable divisor is equal to 11, and after modulated by the baseband signal, the spur frequency $C_2$ and $C_3$ appear on the two sides of the main transmission frequency $C_1$ in the output spectrum of the transmission frequency $F_{tx}$.

Figure 6:
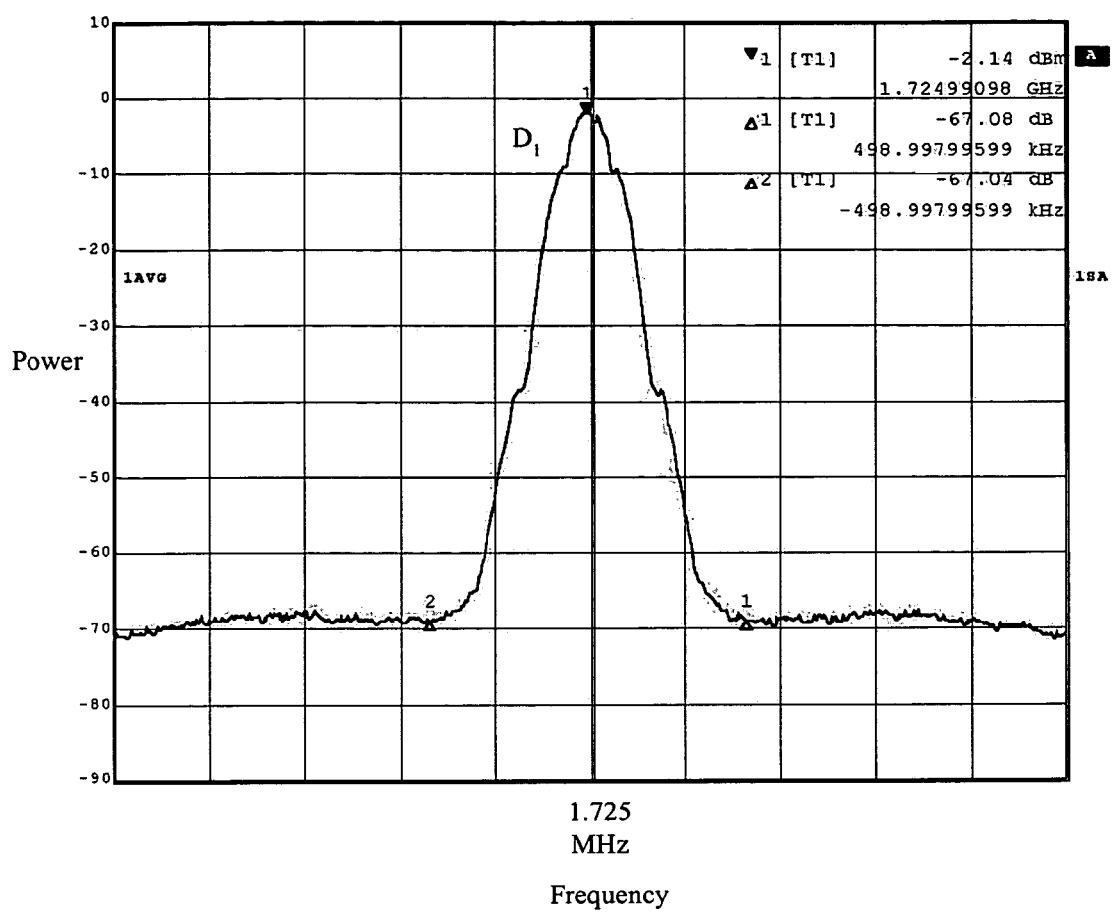
FIG. 6 is an experimental data curve of the transmission frequency modulated by the baseband signal shown in FIG. 4.

Referring to FIG. 6, FIG. 6 is an experimental data curve of the transmission frequency modulated by the baseband signal shown in FIG. 4. When the first programmable divisor is adjusted to 9, there is no spur frequency on the output spectrum of the transmission frequency $F_{tx}$, except the main transmission frequency $D_1$. Therefore, the first programmable divider of the present invention can effectively solve the problem of the transmission frequency $F_{tx}$ when the local oscillating frequency is interfered by a specific multiple frequency and further eliminate the noise in the RF signal.

Figure 7:
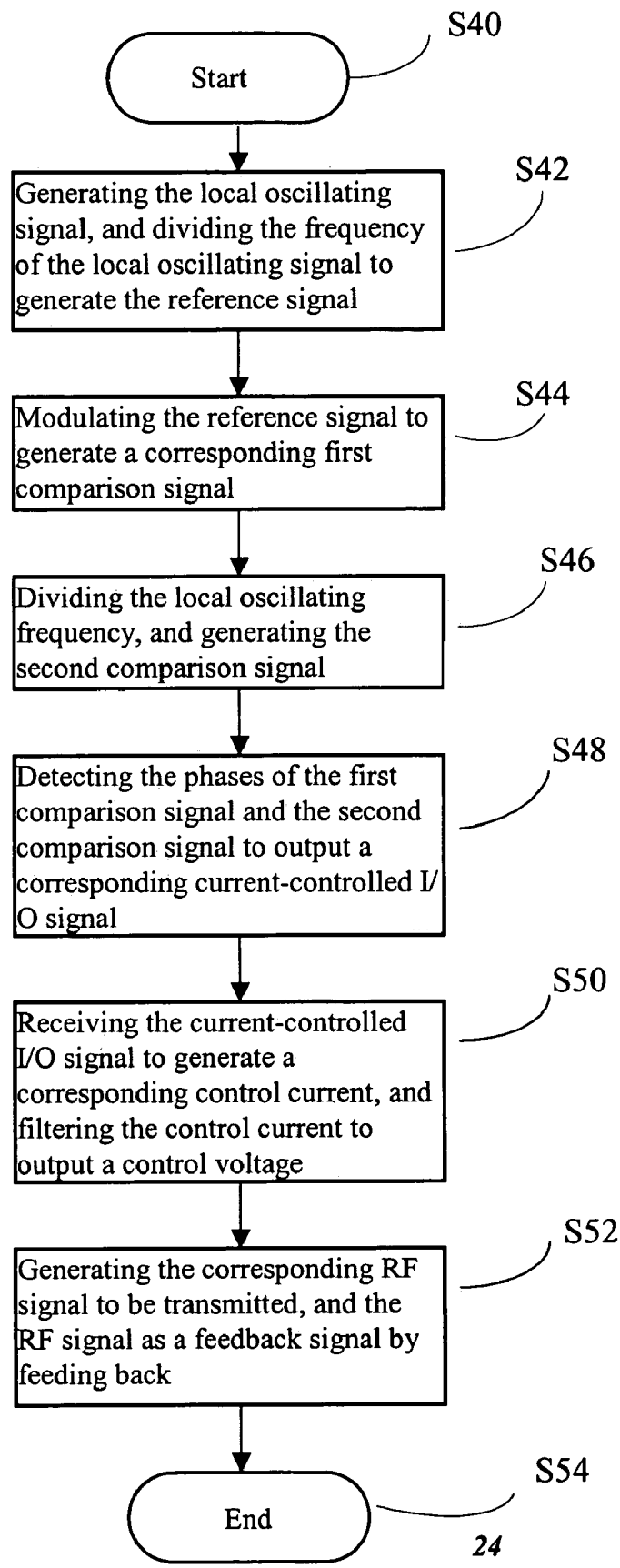
FIG. 7 is a flow chart of the generating method of the RF signal of the phase lock loop shown in FIG. 2.

Referring to FIG. 7, FIG. 7 is a flow chart of the generating method of the RF signal of the phase lock loop 30 shown in FIG. 2. According to the present invention, the RF signal is generated where the phase lock loop 30 receives a baseband signal that has an input frequency Fi, and modulates the baseband signal to be a corresponding RF signal. The RF signal has a predetermined transmission frequency $F_{tx}$ for transmitting. The method comprises the following steps:

S40: Start;

S42: Generating the local oscillating signal with the local oscillating frequency $F_{LO}$ and dividing the frequency of the local oscillating signal by the first programmable divisor M to generate the reference signal $S_{re}$;

S44: Modulating the reference signal $S_{re}$ according to the baseband signal Fi to generate a corresponding first comparison signal S1, after the phase of the reference signal $S_{re}$ is shifted by 90 degrees;

S46: Dividing the local oscillating frequency $F_{LO}$ by the second programmable divisor N and generating the second comparison signal $S_2$ according to the difference between the feedback signal $S_{FB}$ and the local oscillating frequency $F_{LO}$;

S48: Detecting the phases of the first comparison signal $S_1$ and the second comparison signal $S_2$ to output a corresponding current-controlled I/O signal $S_{IQ}$ corresponding to a phase shift of two signals;

S50: Receiving the current-controlled I/O signal $S_{IQ}$ to generate a corresponding control current and filtering the control current I to output a control voltage V;

S52: Generating the corresponding RF signal to be transmitted according to the control voltage V, with the RF signal as a feedback signal $S_{FB}$ by feeding back;

S54: End.

Figure 8:
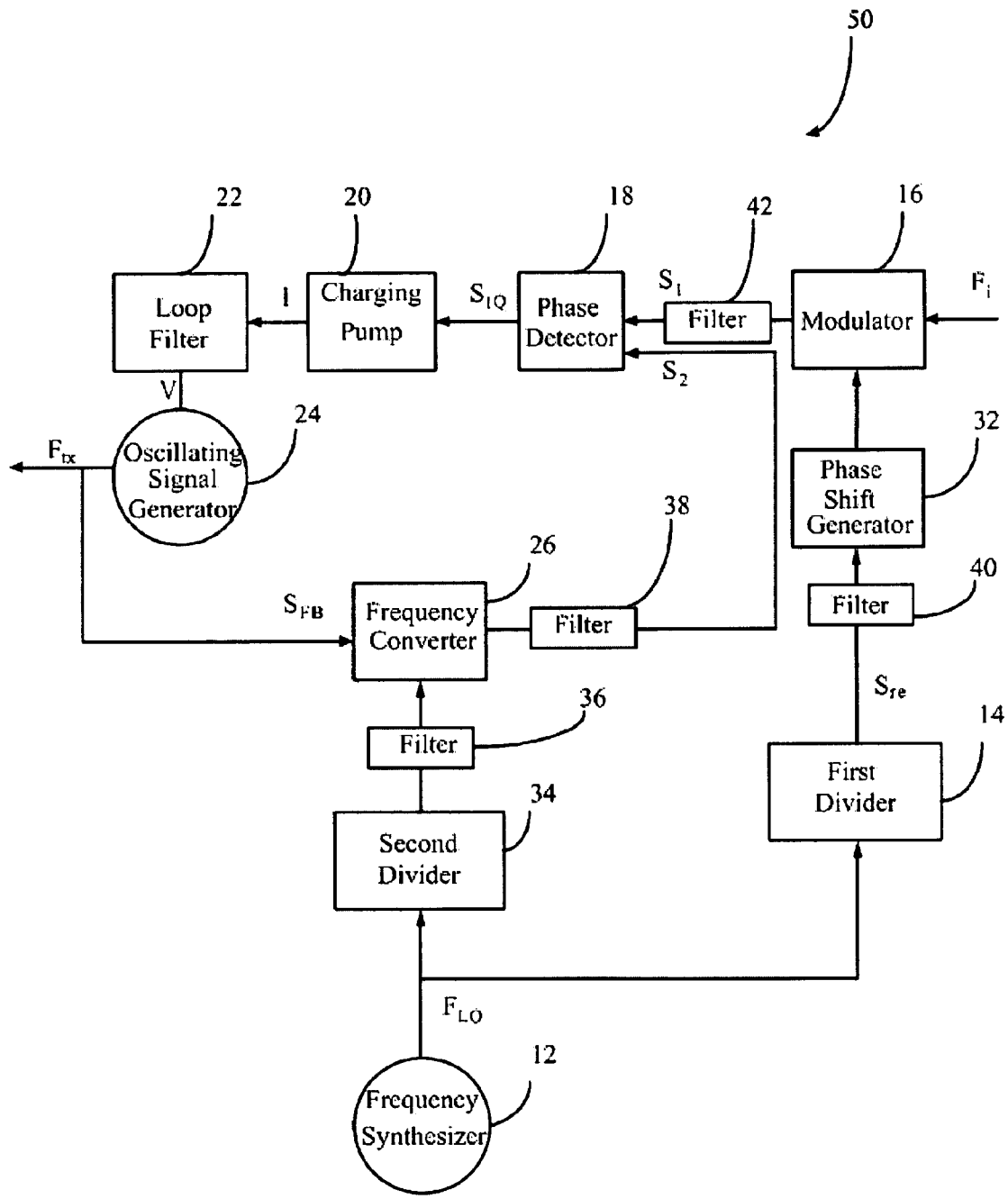
FIG. 8 is a function block diagram of a phase lock loop according to another preferred embodiment of the present invention.

FIG. 8 is a function block diagram of a phase lock loop according to another preferred embodiment of the present invention. The embodiment 50 illustrated in FIG. 8 is similar to the embodiment 30 discussed in FIG. 2, but adds a first filter 36, a second filter 38, a third filter 40, and a fourth filter 42 in some specific places to perform signal filtration for better signal quality and for improving overall performance. For simplified illustration, the same element used in both of the FIG. 2 and FIG. 8 would have the same numerical reference, and would not be explained again to avoid redundancy. Before entering the frequency converter 26, the frequency-divided local oscillating signal from the second programmable divider 34 is first filtered by the filter 36. After leaving the frequency converter 26, the signal is also filtered by the filter 38 and then goes to the phase detector 18. Similarly, the signal from the first programmable divider 14 is filtered by the filter 40, and is then inputted to the phase shift generator 32. The modulated signal from the modulator 16 would also go to the filter 42 first, and then go on to the phase detector 18. It is to remind that filters 36, 38, 40, 42 are not necessary at all times, and are provided for better signal quality and overall performance. Persons skilled in the signal processing and filtration field know in what situation a filter should be employed and what kind of filters is to be utilized.

The present invention provides a phase lock loop for receiving a baseband signal that has an input frequency and modulating the baseband signal to be a corresponding RF signal. The RF signal has a predetermined transmission frequency for transmitting. The phase lock loop comprises a frequency synthesizer, a first programmable divider, a modulator, an oscillating signal generator, and a frequency converter. The first programmable divisor of the first programmable divider is programmable-controlled so as to prevent the occurrence of a spur frequency, besides the predetermined transmission frequency, in the RF signal due to the interfered local oscillating signal. By using the present invention, all channels of the GSM system, can select suitable local oscillating frequency, without causing the problem of lower output signal quality.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A phase lock loop for receiving a baseband signal having an input frequency and modulating the baseband signal to be a corresponding RF signal for transmitting, the phase lock loop comprising:
a frequency synthesizer for generating a local oscillating signal having a local oscillating frequency;
a first programmable divider for dividing the frequency of the local oscillating signal by a first programmable divisor to generate a reference signal;
a modulator for modulating the reference signal according to the baseband signal to generate a first comparison signal;
a phase detector for generating a phase difference signal for representing the phase difference between the first comparison signal and a second comparison signal;
a charging pump for receiving the phase difference signal and accordingly outputting a control current;
a loop filter for filtering the control current to output a control voltage;
an oscillating signal generator for generating the corresponding RF signal having a frequency in responsive to the control voltage, the RF signal being fed back as a feedback signal; and
a frequency converter for receiving the feedback signal and the local oscillating signal to output the second comparison signal to the phase detector in responsive to the frequency difference between the feedback signal and the local oscillating signal;
wherein the first programmable divisor of the first programmable divider and the local oscillating frequency of the local oscillating signal, which is corresponded to said first programmable divisor, are capable of being programmable-controlled only if a carrier frequency of the RF signal substantially equals to a predetermined value.

2. The phase lock loop of claim 1, wherein the phase lock loop further comprises a phase shift generator coupled between the first programmable divider and the modulator, for shifting the phase of the reference signal of the first programmable divider by 90 degrees, and then inputting the phase-shifted reference signal into the modulator.

3. The phase lock loop of claim 1, wherein the phase lock loop further comprises a second programmable divider coupled between the frequency synthesizer and the frequency converter, for dividing the frequency of the local oscillating signal by a second programmable divisor and outputting a divided local oscillating signal to the frequency converter.

4. The phase lock loop of claim 3, wherein only if the carrier frequency of the RF signal substantially equals to a predetermined value, the first programmable divisor of the first programmable divider as well as the corresponding second programmable divisor of the second programmable divider and the corresponding local oscillating frequency of the local oscillating signal are capable of being programmable-controlled.

5. The phase lock loop of claim 3, wherein, the phase lock loop further comprises a phase shift generator coupled between the first programmable divider and the modulator, for shifting the phase of the reference signal of the first programmable divider by 90 degrees, and then inputting the phase-shifted reference signal into the modulator.

6. The phase lock loop of claim 5, wherein, the phase lock loop further includes a first filter to filter the signal from the second programmable divider, a second filter to filter the signal leaving the frequency converter, a third filter to filter the signal from the first programmable divider, and a fourth filter to filter the modulated signal from the modulator.

7. The phase lock loop of claim 3, wherein the transmission frequency of the RF signal is $F_{tx}$, the local oscillating frequency of the local oscillating signal is $F_{LO}$, the first programmable divisor of the first programmable divider is M, the second programmable divisor of the second programmable divider is N, and $F_{tx}$, $F_{LO}$, M, and N satisfy the following equation:

$$F_{tx} = \left(\frac{M \pm N}{M \times N}\right) \times F_{LO}.$$

8. The phase lock loop of claim 1, wherein the phase lock loop merely comprises the only frequency synthesizer to generate the single local oscillating frequency of the local oscillating signal.

9. The phase lock loop of claim 1, wherein the oscillating signal generator comprises a voltage-controlled oscillator and a third frequency divider coupled to an output of the voltage-controlled oscillator.

10. A method for generating an RF signal by utilizing a phase lock loop to receive a baseband signal having an input frequency and to modulate the baseband signal to be a corresponding RF signal for transmitting, the method comprising the steps of:
generating a local oscillating signal having a local oscillating frequency, and dividing the frequency of the local oscillating signal by a first programmable divisor to generate a reference signal;
modulating the reference signal according to the baseband signal to generate a first comparison signal;
generating a phase difference signal for representing the phase difference between the first comparison signal and a second comparison signal;
receiving the phase difference signal to generate a control current, and filtering the control current to output a control voltage; and
generating the corresponding RF signal having a frequency in response to the control voltage, the RF signal being fed back as a feedback signal, and generating the second comparison signal according to the frequency difference between the feedback signal and the local oscillating signal;
wherein the first programmable divisor of the first programmable divider and the local oscillating frequency of the local oscillating signal, which is corresponded to said first programmable divisor, are capable of being programmable-controlled only if a carrier frequency of the RF signal substantially equals to a predetermined value.

11. The method of claim 10, wherein the phase of the reference signal needs to be shifted by 90 degrees first, and then be modulated by the baseband signal.

12. The method of claim 10, wherein the frequency of the local oscillating signal is divided by a second programmable divisor, and then a divided local oscillating signal is generated.

13. The method of claim 12, wherein only if the carrier frequency of the RF signal substantially equals to a predetermined value, the first programmable divisor as well as the corresponding second programmable divisor and the corresponding local oscillating frequency of the local oscillating signal are capable of being programmable-controlled.

14. The method of claim 12, wherein the phase of the reference signal needs to be shifted by 90 degrees first, and then to be modulated by the baseband signal.

15. The method of claim 12, wherein the transmission frequency of the RF signal is $F_{tx}$, the local oscillating frequency of the local oscillating signal is $F_{LO}$, the first programmable divisor is M, the second programmable divisor is N, $F_{tx}$ and $F_{LO}$ satisfy the following equation:

$$F_{tx} = \left(\frac{M \pm N}{M \times N}\right) \times F_{LO}.$$

16. The method of claim 10, wherein the method merely utilizes a frequency synthesizer to generate the local oscillating signal.

17. A phase lock loop for receiving a baseband signal having an input frequency and modulating the baseband signal to be a corresponding RF signal for transmitting, the phase lock loop comprising:
- a frequency synthesizer for generating a local oscillating signal having a local oscillating frequency;
- a first programmable divider for dividing the frequency of the local oscillating signal by a first programmable divisor to generate a reference signal;
- a modulator for modulating the reference signal according to the baseband signal to generate a first comparison signal;
- a phase shift generator, coupled between the first programmable divider and the modulator, for shifting the phase of the reference signal of the first programmable divider by 90 degrees, and then inputting the phase-shifted reference signal into the modulator;
- a phase detector for generating a phase difference signal for representing the phase difference between the first comparison signal and a second comparison signal;
- a charging pump for receiving the phase difference signal and accordingly outputting a control current;
- a loop filter for filtering the control current to output a control voltage;
- an oscillating signal generator for generating the corresponding RF signal having a frequency in responsive to the control voltage, the RF signal being fed back as a feedback signal; and
- a frequency converter for receiving the feedback signal and the local oscillating signal to output the second comparison signal to the phase detector in responsive to the frequency difference between the feedback signal and the local oscillating signal;

wherein the first programmable divisor of the first programmable divider and the local oscillating frequency of the local oscillating signal, which is corresponded to said first programmable divisor, are capable of being programmable-controlled when a carrier frequency of the RF signal substantially equals to a predetermined value.

18. The phase lock loop of claim 17, wherein the phase lock loop further comprises a second programmable divider coupled between the frequency synthesizer and the frequency converter, for dividing the frequency of the local oscillating signal by a second programmable divisor and outputting a divided local oscillating signal to the frequency converter.

19. The phase lock loop of claim 18, wherein when the carrier frequency of the RF signal substantially equals to a predetermined value, the first programmable divisor of the first programmable divider as well as the corresponding second programmable divisor of the second programmable divider and the corresponding local oscillating frequency of the local oscillating signal are capable of being programmable-controlled.

20. The phase lock loop of claim 18, wherein, the phase lock loop further comprises a phase shift generator coupled between the first programmable divider and the modulator, for shifting the phase of the reference signal of the first programmable divider by 90 degrees, and then inputting the phase-shifted reference signal into the modulator.

21. The phase lock loop of claim 20, wherein, the phase lock loop further includes a first filter to filter the signal from the second programmable divider, a second filter to filter the signal leaving the frequency converter, a third filter to filter the signal from the first programmable divider, and a fourth filter to filter the modulated signal from the modulator.

22. The phase lock loop of claim 18, wherein the transmission frequency of the RF signal is $F_{tx}$, the local oscillating frequency of the local oscillating signal is $F_{LO}$, the first programmable divisor of the first programmable divider is M, the second programmable divisor of the second programmable divider is N, and $F_{tx}$, $F_{LO}$, M, and N satisfy the following equation:

$$F_{tx} = \left(\frac{M \pm N}{M \times N}\right) \times F_{LO}.$$

23. The phase lock loop of claim 17, wherein the phase lock loop merely comprises the only frequency synthesizer to generate the single local oscillating frequency of the local oscillating signal.

24. The phase lock loop of claim 17, wherein the oscillating signal generator comprises a voltage-controlled oscillator and a third frequency divider coupled to an output of the voltage-controlled oscillator.

* * * * *